(12) United States Patent
Yan et al.

(10) Patent No.: US 7,521,949 B2
(45) Date of Patent: Apr. 21, 2009

(54) TEST PIN, METHOD OF MANUFACTURING SAME, AND SYSTEM CONTAINING SAME

(75) Inventors: Hongfei Yan, Mesa, AZ (US); Gang Yuan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/800,689

(22) Filed: May 7, 2007

(65) Prior Publication Data

US 2008/0278187 A1 Nov. 13, 2008

(51) Int. Cl.
*G01R 31/02* (2006.01)

(52) U.S. Cl. .................. 324/761; 439/700; 439/482; 324/754

(58) Field of Classification Search ......... 324/754–756, 324/758, 761–762, 765; 439/482, 700; 29/882
See application file for complete search history.

(56) References Cited

U.S. PATENT DOCUMENTS

| | | | | |
|---|---|---|---|---|
| 4,773,877 A | * | 9/1988 | Kruger et al. | 439/482 |
| 5,703,494 A | * | 12/1997 | Sano | 324/761 |
| 6,358,097 B1 | * | 3/2002 | Peters | 439/700 |
| 6,396,293 B1 | * | 5/2002 | Vinther et al. | 324/761 |
| 6,626,708 B2 | * | 9/2003 | Phillips | 439/700 |
| 6,783,405 B1 | * | 8/2004 | Yen | 439/824 |
| 7,256,593 B2 | * | 8/2007 | Treibergs | 324/754 |
| 2007/0139062 A1 | * | 6/2007 | Kang | 324/754 |

FOREIGN PATENT DOCUMENTS

| | | |
|---|---|---|
| KR | 10-2001-0071814 A | 7/2001 |
| KR | 10-2003-0014711 A | 2/2003 |
| KR | 20-0312403 Y1 | 5/2003 |
| KR | 10-2003-0095926 A | 12/2003 |

OTHER PUBLICATIONS

International Search Report and Written Opinion of the Searching Authority; Dated Jul. 30, 2008; PCT/US2008/060975; 9 pgs.

* cited by examiner

*Primary Examiner*—Ha Tran T Nguyen
*Assistant Examiner*—Arleen M Vazquez
(74) *Attorney, Agent, or Firm*—Kenneth A. Nelson; Intel Corporation

(57) ABSTRACT

A test pin includes a compression element (110), a first tip (120) physically coupled to a first end (111) of the compression element, a second tip (130) physically coupled to a second end (112) of the compression element, a first arm (140) physically coupled to a first side (121) of the first tip, and a second arm (150) physically coupled to a second side (122) of the first tip.

11 Claims, 5 Drawing Sheets

TEST PIN, METHOD OF MANUFACTURING SAME, AND SYSTEM CONTAINING SAME

FIELD OF THE INVENTION

The disclosed embodiments of the invention relate generally to semiconductor device testing, and relate more particularly to test hardware for semiconductor device testing.

BACKGROUND OF THE INVENTION

Current trends in semiconductor device manufacturing point to higher frequency, higher input/output (I/O) count, smaller pitch, thinner packages, and increasing package body sizes with multiple cores. These trends require test contact technology to have higher compliance due to increasing package warpage, lower contact inductance due to higher frequency, lower contact force due to decreased package thickness and increased I/O counts due to the higher package I/O count. The need for high pin count also drives test tooling costs higher. Existing test pins have electrical paths that are overly long, resulting in high inductance and a low data rate, and/or are relatively expensive to make. Accordingly, there exists a need for a highly compliant test pin that is robust and inexpensive and that does not suffer from an overly long electrical path.

BRIEF DESCRIPTION OF THE DRAWINGS

The disclosed embodiments will be better understood from a reading of the following detailed description, taken in conjunction with the accompanying figures in the drawings in which.

Figure 1:
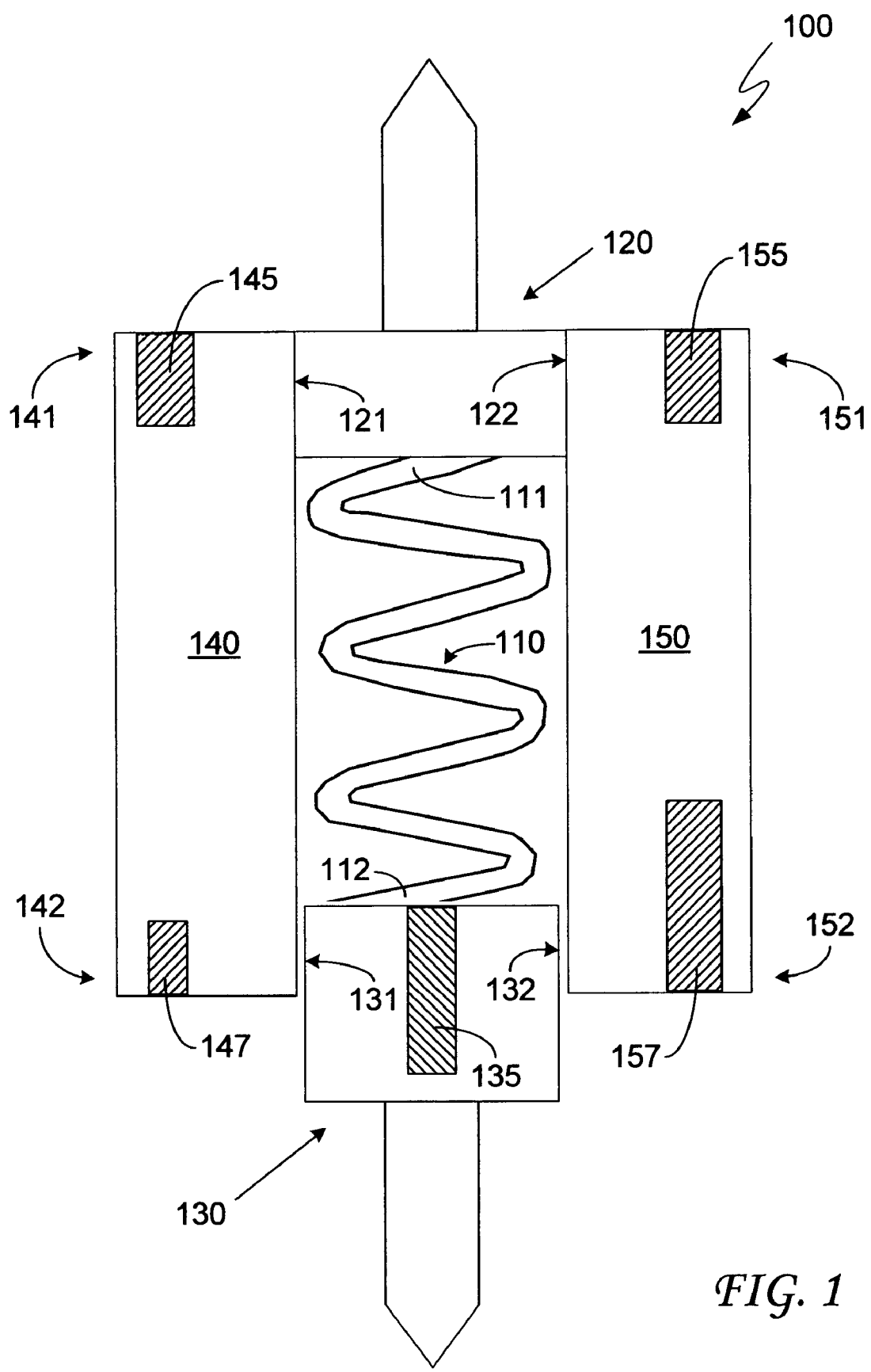
FIG. 1 is a front elevational view of a test pin according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a test pin comprises a compression element, a first tip physically coupled to a first end of the compression element, a second tip physically coupled to a second end of the compression element, a first arm physically coupled to a first side of the first tip, and a second arm physically coupled to a second side of the first tip. Embodiments of the invention may be useful in connection with, among other possibilities, motherboard sockets for land grid array (LGA) packages, including LGA OEM sockets, test/burn-in sockets for LGA packages, ball grid array (BGA) packages, including "balls anywhere" packages, quad flat no-lead (QFN) packages, for thin array plastic packages (TAPPs), for RF products, central processing units (CPUs), and chipsets. Similarly, embodiments of the invention may be configured to work well with compression mount (CMT), surface mount (SMT), and plated through hole (PTH) mount to printed circuit boards (PCBs) by adjusting the design of one or both of the test pin tips for the specific mounting type in a manner that will be apparent to one of ordinary skill in the art.

Embodiments of the invention take advantage of the excellent formability of certain new materials (discussed below) by forming two arms between which a contact tip may slide. The two-arm design provides a short electrical path while maintaining a stamp-formed spring between two contact tips. Embodiments of the invention may offer advantages (such as short electrical path and vertical actuation) that are also offered by existing spring probe designs, but at significantly lower cost.

Referring now to the drawings, FIG. 1 is a front elevational view of a test pin 100 according to an embodiment of the invention. As illustrated in FIG. 1, test pin 100 comprises a compression element 110, a tip 120 physically coupled to an end 111 of compression element 110, a tip 130 physically coupled to an end 112 of compression element 110, an arm 140 physically coupled to a side 121 of tip 120, and an arm 150 physically coupled to a side 122 of tip 120.

In one embodiment, compression element 110, tips 120 and 130, and arms 140 and 150 are made of a readily formable material such as beryllium copper or the like. As an example, compression element 110 can be a spring or a similar component. Increasing the number of spring coils may result in a more robust and longer-lasting compression element. In one embodiment, test pin 100 may have more than one compression element in order to increase its compression force, or it may have C-shaped buckles at either side of compression element 110. Other arrangements and compression components are also possible, as will be apparent to one of ordinary skill in the art.

FIG. 1 depicts test pin 100 in a preliminary position before arms 140 and 150 have been folded. Test pin 100 will be depicted in a folded form in a subsequent figure and will be further discussed below.

In the embodiment illustrated in FIG. 1, arm 140 has a top portion 141 and a bottom portion 142 and arm 150 has a top portion 151 and a bottom portion 152. Top portion 141 is physically coupled to side 121 of tip 120 and top portion 151 is physically coupled to side 122 of tip 120. Bottom portion 142 is adjacent to but not physically coupled to a side 131 of tip 130 and bottom portion 152 is adjacent to but not physically coupled to a side 132 of tip 130.

Top portion 141 comprises an indentation 145. Top portion 151 comprises an indentation 155. Bottom portion 142 comprises an indentation 147. Bottom portion 152 comprises an indentation 157. Tip 130 comprises a projection 135. In one embodiment, one or more of projection 135 and indentations 145, 147, 155, and 157 function to prevent test pin 100 from jamming, or to minimize the frequency or the severity of such jams in test pin 100. As an example, one or more of projection 135 and indentations 145, 147, 155, and 157 prevent tip 130 from moving horizontally (perpendicular to a long axis of compression element 110) and only allow it to move vertically (parallel to a long axis of compression element 110) in the direction of an arrow 199. In one embodiment, projection 135 extends into at least one of indentation 147 and indentation 157 in order to guide tip 130 in its vertical motion.

Figure 2:
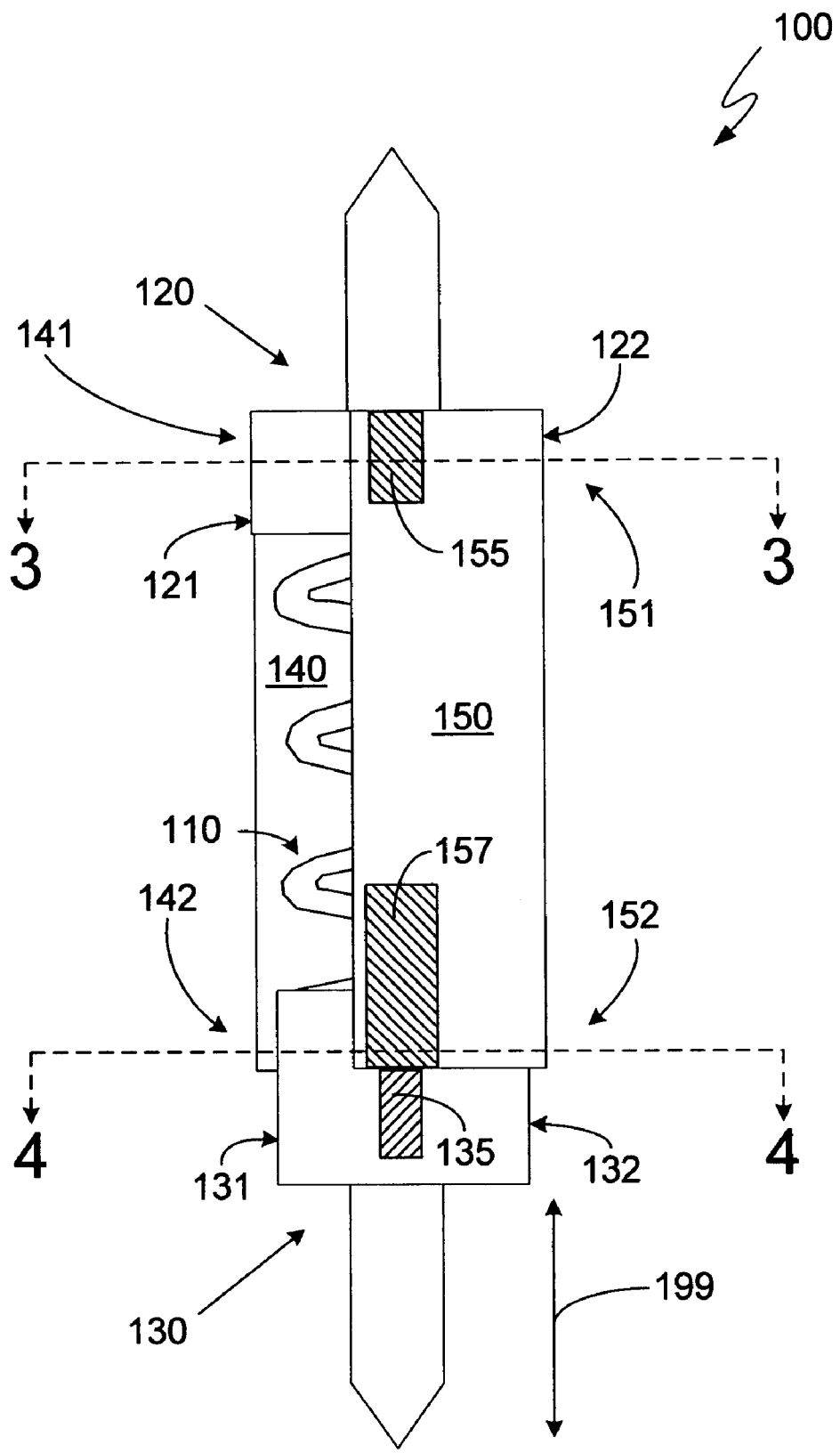
FIG. 2 is a front elevational view of the test pin of FIG. 1 after it has been folded according to an embodiment of the invention.

FIG. 2 is a front elevational view of test pin 100 after it has been folded according to an embodiment of the invention. As illustrated in FIG. 2, arm 150 is folded such that a portion of arm 150 forms a front of test pin 100 and arm 140 is folded such that a portion of arm 140 forms a back of test pin 100. To reiterate a concept that was first explained above, the terms "front" and "back," as well as "left" and "right" and others, are used for descriptive purposes and not necessarily for describing permanent relative positions. As applied to the current discussion of a front and a back of test pin 100, what has here been called the front could just as well be thought of as the back, and vice versa, just as what may be referred to a right side may just as well be thought of as a left side, and so forth.

In the illustrated embodiment, arm 150 leaves a portion of compression element 110 exposed at the front of test pin 100 and, though not explicitly illustrated, arm 140 leaves a portion of compression element 110 exposed at the back of test pin 100. In other words, in the illustrated embodiment arms 140 and 150 do not extend all the way across the front face or the back face of test pin 100, and do not entirely wrap around or enclose compression element 110. One advantage of this configuration is that less material is used, thereby further reducing the cost of test pin 100. It should be noted, however, that in spite of this partial exposure of compression element 110, the exposure is not so great that it leads to potential pin jam issues such as are common with existing stamp/coil spring hybrid contact technologies.

The design of test pin 100 is scalable with land or solder ball pitches. In an embodiment based on a strip metal thickness of 0.05 millimeters (mm), test pin 100 may be made with a first dimension (e.g., a thickness) as small as approximately 0.25 mm, a second dimension (e.g., a width) as small as approximately 0.4 mm, and a third dimension (e.g., a height) as small as approximately 1.5 mm. As an example, a test pin having these dimensions may be compatible with or well-suited for a fine pitch LGA, BGA, or dual-row QFN (DR-QFN) package having a land or solder ball pitch of approximately 0.3 to 0.4 mm in-line or approximately 0.5 mm in array.

Referring still to FIG. 2, an example of an electrical path according to an embodiment of the invention extends along tip 120, through indentation 155 and along arm 150, through indentation 157 and projection 135, and along tip 130. Other electrical paths following other routes through test pin 100 are also possible, but the electrical path just described is a short electrical path that allows a relatively low inductance rate and a relatively high data rate, as desired.

Figure 3:
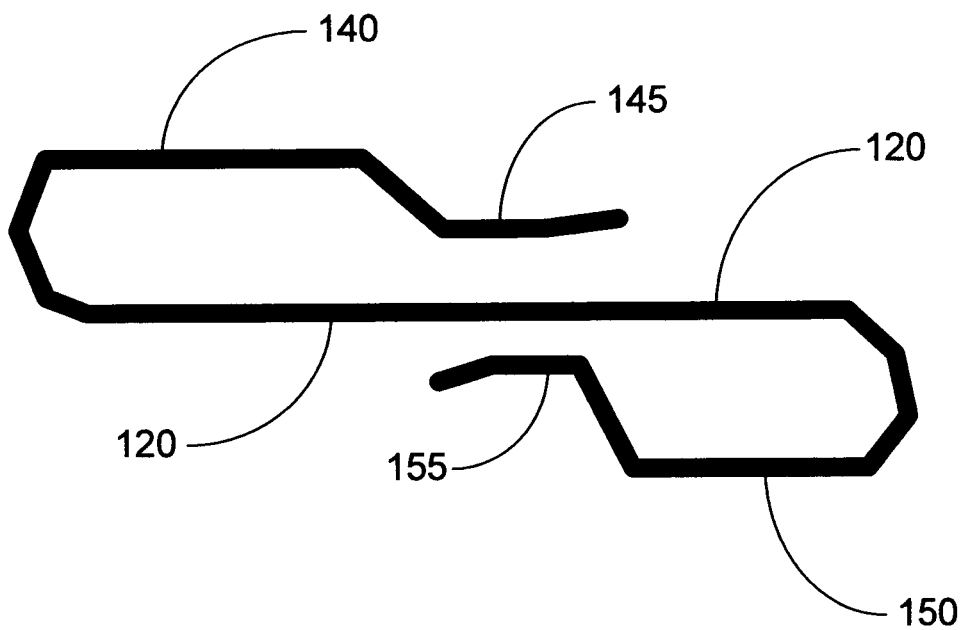
FIG. 3 is a cross-sectional view of the test pin of FIG. 1 taken along a line 3-3 in FIG. 2 according to an embodiment of the invention.
Figure 4:
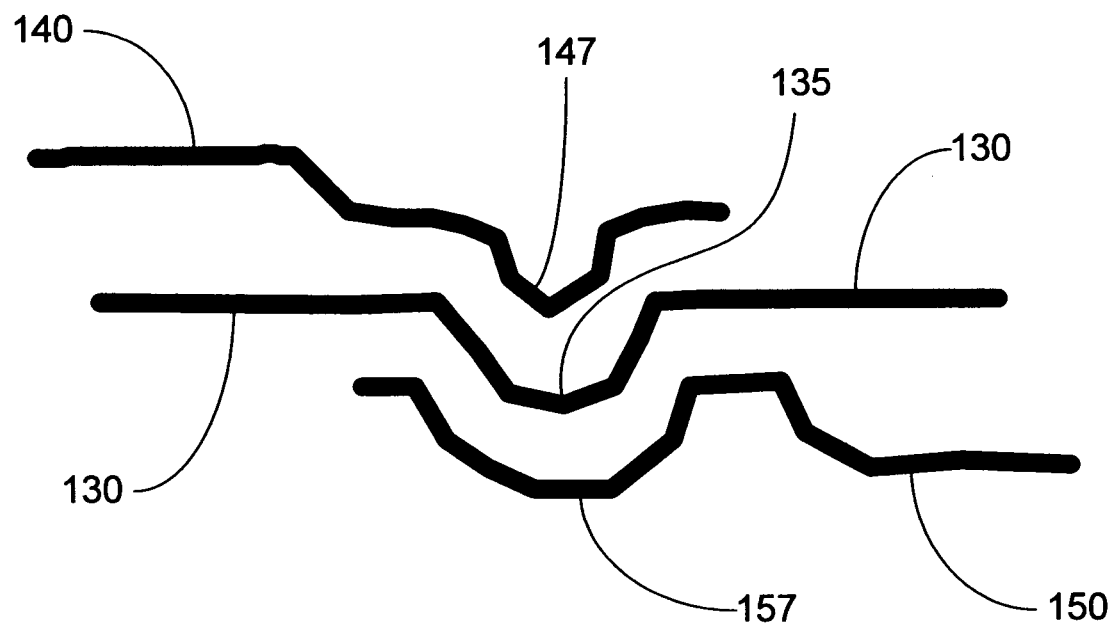
FIG. 4 is a cross-sectional view of the test pin of FIG. 1 taken along a line 4-4 in FIG. 2 according to an embodiment of the invention.

FIG. 3 is a cross-sectional view of test pin 100 taken along a line 3-3 in FIG. 2 and FIG. 4 is a cross-sectional view of test pin 100 taken along a line 4-4 in FIG. 2 according to an embodiment of the invention. For purposes of illustration and clarity, FIGS. 3 and 4 are depicted on a larger scale than that of FIGS. 1 and 2. Depicted in FIG. 3 are tip 120, arms 140 150, and indentations 145 and 155. Depicted in FIG. 4 are tip 130, arms 140 and 150, indentations 147 and 157, and projection 135.

Figure 5:
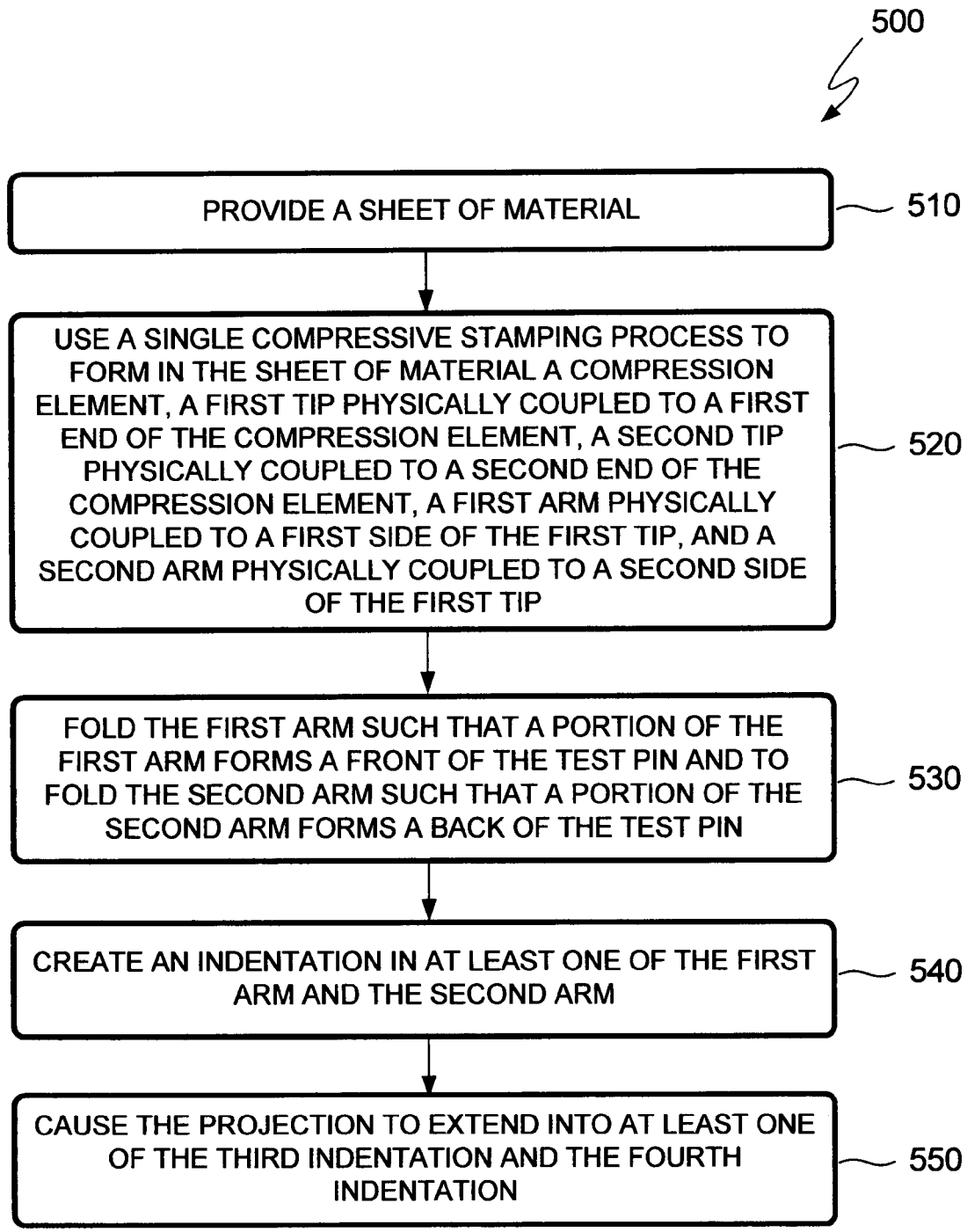
FIG. 5 is a flowchart illustrating a method of manufacturing a test pin according to an embodiment of the invention.

FIG. 5 is a flowchart illustrating a method 500 of manufacturing a test pin according to an embodiment of the invention. A step 510 of method 500 is to provide a strip of material. As an example, the strip of material can be made of beryllium copper or a similarly formable material.

A step 520 of method 500 is to use a single compressive stamping process to form in the strip of material a compression element, a first tip physically coupled to a first end of the compression element, a second tip physically coupled to a second end of the compression element, a first arm physically coupled to a first side of the first tip, and a second arm physically coupled to a second side of the first tip. As an example, the compression element, the first tip, the second tip, the first arm, and the second arm can be similar to, respectively, compression element 110, tip 120, tip 130, arm 140, and arm 150, all of which were first shown in FIG. 1. Using a single compressive stamping process to form a test pin having the foregoing components keeps the cost of embodiments of the test pin relatively low. As an example, forming the test pin in a single compressive stamping process eliminates the expense of a secondary assembly process involving coil spring installation.

In one embodiment, step 520 comprises forming the first arm with a first top portion and a first bottom portion and forming the second arm with a second top portion and a second bottom portion. As an example, the first top portion, the first bottom portion, the second top portion, and the second bottom portion can be similar to, respectively, portion 141, portion 142, portion 151, and portion 152, all of which were first shown in FIG. 1. In the same or another embodiment, step 520 comprises forming a projection on the second tip. As an example, the projection can be similar to projection 135, first shown in FIG. 1.

A step 530 of method 500 is to fold the first arm such that a portion of the first arm forms a front of the test pin and to fold the second arm such that a portion of the second arm forms a back of the test pin. In one embodiment, rather than folding both arms in a single step, the first arm may be folded in a first step or sub-step and the second arm may be folded in a second step or sub-step. As an example, step 530 or another step or steps may leave a portion of the compression element exposed at the front of the test pin and/or a portion of the compression element exposed at the back of the test pin.

A step 540 of method 500 is to create an indentation in at least one of the first arm and the second arm. As an example, the indentation can be similar to one or more of indentations 145, 147, 155, and 157, all of which were first shown in FIG. 1. In one embodiment, step 540 comprises creating a first indentation in the first top portion, creating a second indentation in the second top portion, creating a third indentation in the first bottom portion, and creating a fourth indentation in the second bottom portion. As an example, the first indentation, the second indentation, the third indentation, and the fourth indentation can be similar to, respectively, indentation 145, indentation 155, indentation 147, and indentation 157, all of which were first shown in FIG. 1.

A step 550 of method 500 is to cause the projection to extend into at least one of the third indentation and the fourth indentation. As an example, step 550, perhaps in conjunction with other steps, may prevent the test pin from jamming or otherwise failing during operation.

Figure 6:
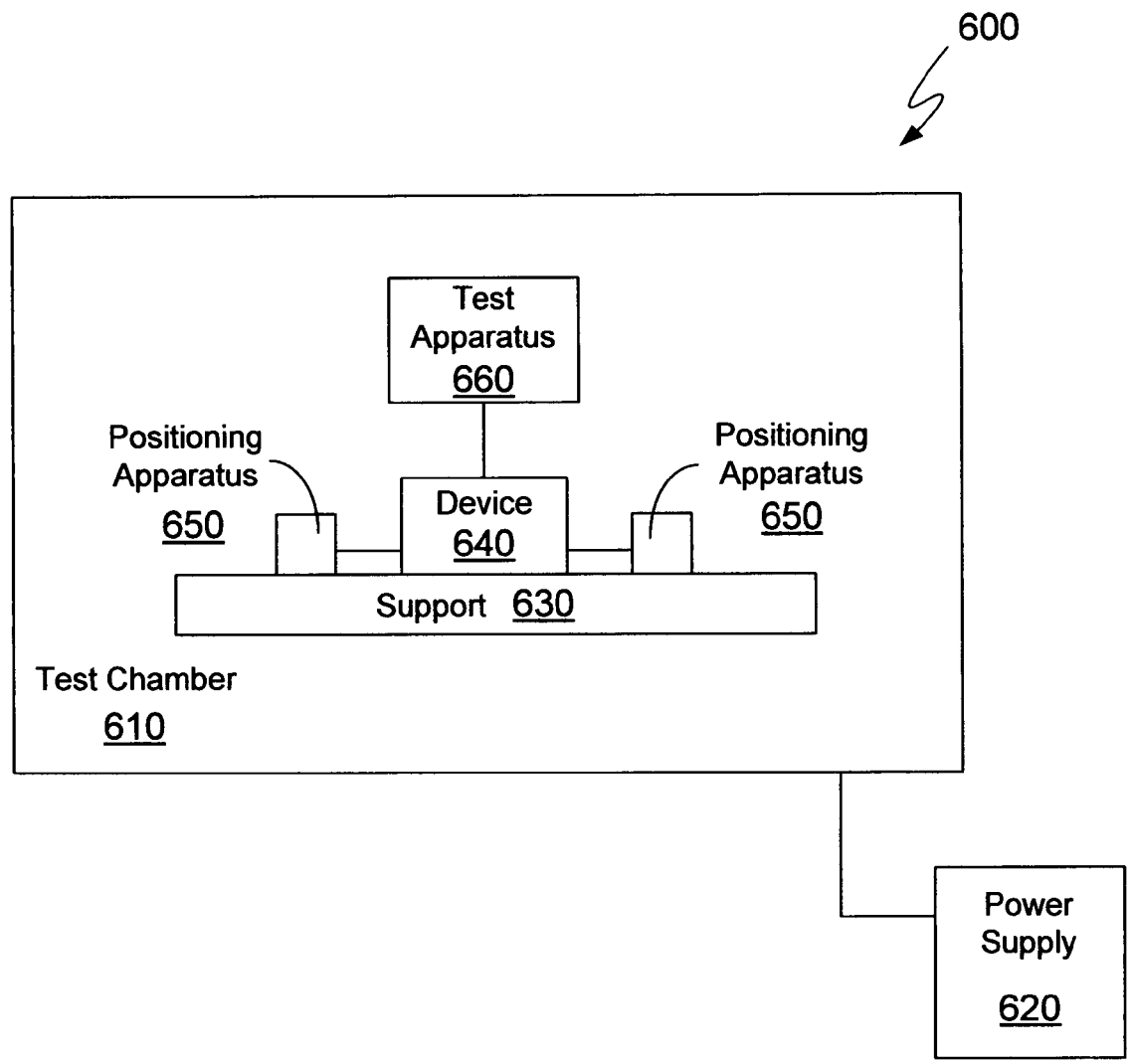
FIG. 6 is a schematic representation of a system that includes a test pin according to an embodiment of the invention.

FIG. 6 is a schematic representation of a system 600 that includes a test pin according to an embodiment of the invention. As illustrated in FIG. 6, system 600 comprises a test chamber 610, a power supply 620, a support 630 for supporting a device 640 in test chamber 610, positioning apparatus 650 capable of positioning device 640 in a test position and in a non-test position in the test chamber, and test apparatus 660 to test device 640. It should be understood that the schematic of FIG. 6 is not intended to necessarily suggest the physical appearance or the actual component arrangement of a real test system, but only to indicate what those components may be according to an embodiment of the invention.

Test apparatus 660 includes a test pin comprising a compression element, a first tip physically coupled to a first end of the compression element, a second tip physically coupled to a second end of the compression element, a first arm physically coupled to a first side of the first tip, and a second arm physically coupled to a second side of the first tip. Accordingly, the test pin can be similar to test pin 100, first shown in FIG. 1 and described above.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the test pin and related methods and systems discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A test pin comprising: a compression element; a first tip physically coupled to a first end of the compression element; a second tip physically coupled to a second end of the compression element; a first arm physically coupled to a first side of the first tip; and a second arm physically coupled to a second side of the first tip, wherein: a portion of the first arm extends away from the first side of the first tip and wherein when the first arm is folded toward the second side of the first tip, the portion of the first arm forms a front panel that extends at least from the first end of the compression element to the second end of the compression element; and a portion of the second arm extends away from the second side of the first tip and wherein when the second arm is folded toward the first side of the first tip, the portion of the second arm forms a back panel that extends at least from the first end of the compression element to the second end of the compression element.

2. The test pin of claim 1 wherein:
the first arm leaves a portion of the compression element exposed at the front of the test pin; and
the second arm leaves a portion of the compression element exposed at the back of the test pin.

3. The test pin of claim 1 further comprising:
an indentation in at least one of the first arm and the second arm.

4. The test pin of claim 1 wherein:
the first arm has a first top portion and a first bottom portion and the second arm has a second top portion and a second bottom portion;
the first top portion is physically coupled to the first side of the first tip and the second top portion is physically coupled to the second side of the first tip;
the first bottom portion is adjacent to but not physically coupled to a first side of the second tip; and
the second bottom portion is adjacent to but not physically coupled to a second side of the second tip.

5. The test pin of claim 4 wherein:
the first top portion comprises a first indentation; and
the second top portion comprises a second indentation.

6. The test pin of claim 5 wherein:
the first bottom portion comprises a third indentation; and
the second bottom portion comprises a fourth indentation.

7. The test pin of claim 6 wherein:
the second tip comprises a projection; and
the projection extends into at least one of the third indentation and the fourth indentation.

8. The test pin of claim 1 wherein:
the test pin has a first dimension of approximately 0.25 millimeters;
the test pin has a second dimension of approximately 0.4 millimeters; and
the test pin has a third dimension of approximately 1.5 millimeters.

9. The test pin of claim 1 wherein:
the compression element, the first tip, the second tip, the first arm, and the second arm are made of beryllium copper.

10. A system comprising: a test chamber, a power supply electrically coupled to the test chamber; a support for supporting a device in the test chamber, positioning apparatus within the test chamber adjacent to the support, the positioning apparatus capable of positioning the device in a test position and in a non-test position; and test apparatus to test the device, wherein the test apparatus is located within the test chamber adjacent to the support and includes a test pin comprising: a compression element; a first tip physically coupled to a first end of the compression element; a second tip physically coupled to a second end of the compression element; a first arm physically coupled to a first side of the first tip; and a second arm physically coupled to a second side of the first tip, wherein: a portion of the first arm extends away from the first side of the first tip and wherein when the first arm is folded toward the second side of the first tip, the portion of the first arm forms a front panel that extends at least from the first end of the compression element to the second end of the compression element; and a portion of the second arm extends away from the second side of the first tip and wherein when the second arm is folded toward the first side of the first tip, the portion of the second arm forms a back panel that extends at least from the first end of the compression element to the second end of the compression element.

11. The system of claim 10 wherein:
the compression element, the first tip, the second tip, the first arm, and the second arm are made of beryllium copper.

* * * * *